United States Patent [19]

Daley et al.

[11] Patent Number: 5,066,360

[45] Date of Patent: Nov. 19, 1991

[54] PAD PRINTING OF RESIST OVER VIA HOLES

[75] Inventors: Lawrence R. Daley; Gerald G. Leslie, II, both of Lexington, Ky.

[73] Assignee: International Business Machines Corp., Armonk, N.Y.

[21] Appl. No.: 586,923

[22] Filed: Sep. 24, 1990

[51] Int. Cl.$^5$ ............................ B44C 1/22; C23F 1/02
[52] U.S. Cl. ..................................... 156/660; 156/630; 156/634; 156/656; 156/659.1; 156/902
[58] Field of Search ............ 156/630, 634, 656, 659.1, 156/660, 661.1, 901, 902, 230, 232, 240

[56] References Cited

U.S. PATENT DOCUMENTS

| | | | |
|---|---|---|---|
| 3,701,317 | 10/1972 | Miyamoto et al. | 101/170 |
| 4,127,436 | 11/1978 | Friel | 156/630 |
| 4,327,167 | 4/1982 | Tanabe | 430/31 |
| 4,522,671 | 6/1985 | Gunwald et al. | 156/235 |
| 4,911,786 | 3/1990 | Kindl et al. | 156/659.1 |
| 4,964,947 | 10/1990 | Yarita et al. | 156/645 |

FOREIGN PATENT DOCUMENTS 01283991 11/1989 Japan.

*Primary Examiner*—William A. Powell
*Attorney, Agent, or Firm*—John Brady; William Steinberg

[57] ABSTRACT

Transfer printing from pad (9) is made in a pattern of resist (15) which covers a via (3) on a circuit board (1) metalized with a continuous copper layer (7). After transfer of resist material (14) to the pad, the pattern on the pad is hardened enough to be self-supporting by applying moderate radiation or allowing solvent to escape from the resist on the pad. The resist is transferred from the pad to the circuit board (1) and is then fully hardened, and the circuit board is immersed in etchant to remove unprotected copper (7). Copper in the covered vias is protected and therefore separate metalizations of vias is avoided. Since pad printing is particularly useful in general with three dimensional circuit boards, the use of pad printing to avoid separate metalization of vias is economic since it involves little additional to the general use.

6 Claims, 1 Drawing Sheet

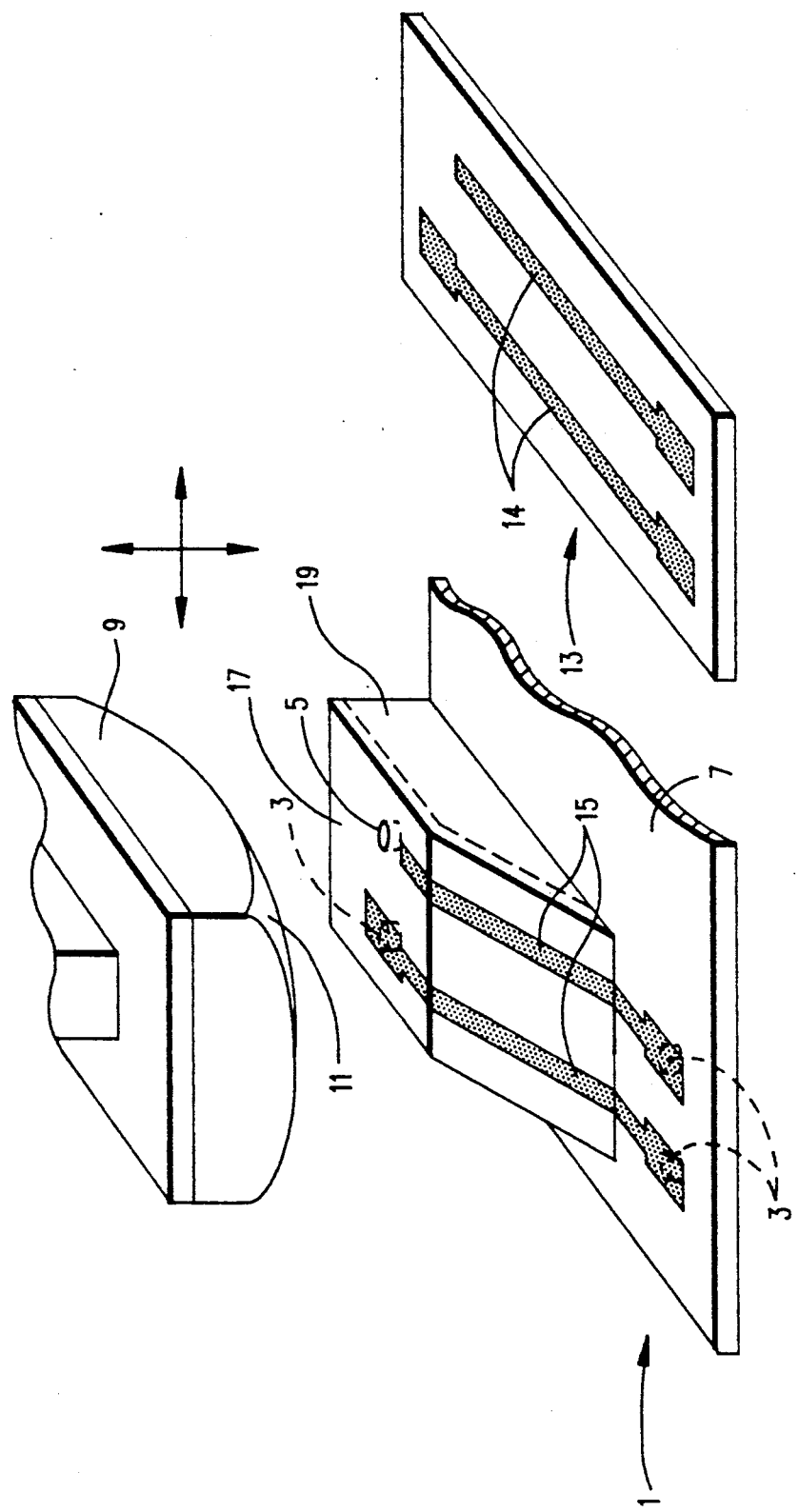

PAD PRINTING OF RESIST OVER VIA HOLES

DESCRIPTION

1. Technical Field

This invention relates to the manufacture of printed circuit boards, and, more specifically, relates to the application of resist onto a metalized board to define circuit patterns. Metal is chemically etched away at locations not covered by the resist. This invention relates to applying such resist in a manner to cover metalized via holes so as to protect the metal inside the holes during the etching.

2. Background of the Invention

The use of a pad or stamp to apply patterns in printed circuit manufacture is disclosed in U.S. Pat. No. 3,701,317 to Miyamoto et al; U.S. Pat. No. 4,522,671 to Grunwald et al, and Japanese Patent No. 01-283991 dated Nov. 15, 1988. These do not, however, disclose the applying of resist to protect holes from etchant.

Prior to this invention holes to be metalized typically have been made subsequent to etching circuit patterns on the circuit board being manufactured because the metal in the holes would be etched away during the etching of the circuit pattern. This generally requires metalizing, followed by application of a resist pattern, followed by etching, and then subsequent formation and metalizing of the holes.

DISCLOSURE OF THE INVENTION

In accordance with this invention, the resist pattern is applied, at least in part, by transfer printing. (Transfer printing is the applying of a pattern from a pad, sometimes called a stamp.) The pattern is designed to both define a circuit pattern on the surface of the circuit board and to cover at least one hole on the circuit board which is to remain metalized. Prior to application of the pad, the resist is hardened somewhat, such as by moderate radiation or evaporation of solvent. This hardened resist is sufficiently self-supporting to remain over the hole that it covers. The resist is then fully hardened by radiation, and the circuit board etched to leave a copper pattern. The covering of the hole protects the metalization in the hole from the etchant so that no additional step need be taken to metalize the hole.

Transfer printing has particular value for three dimensional circuit cards since it prints well simultaneously in three dimensions and across surfaces meeting at an angle. Thus, for three dimensional circuit cards, transfer printing may be conducted regardless of this invention, and the existence of that capability renders the implementation of this invention potentially very low in cost as it requires little additional apparatus or steps.

BRIEF DESCRIPTION OF THE DRAWING

The details of this invention will be described in connection with the accompanying drawing showing a printed circuit card in the process of manufacture in accordance with this invention.

BEST MODE FOR CARRYING OUT THE INVENTION

In the drawing a circuit board substrate 1, which may be, for example a glass-reinforced injection molded polyimide, has via holes 3 and 5 formed through it, typically by molding of the holes. The entire surface is metalized with a thin layer of copper 7. Metalization techniques to form layer 7 are known and form no part of this invention.

A transfer pad 9 is positioned to be moved into contact with substrate 1 and to then move out of contact. The printing surface 11 of pad 9 is a silicone rubber for which the exact composition is not known to be significant to this invention. Surface 11 of pad 9 is first brought into contact with master pattern 13 carrying resist material 14 in the pattern to be transferred.

Master pattern 13 may be formed by etching the desired circuit pattern in a steel panel to a depth of 0.0014 inch (0.0036 cm) using conventional resist and optical techniques. The resist material 14 to be used for this invention is then applied to master pattern 13 and excess is squeegeed off by doctoring with a steel blade. Surface 11 of pad 9 is then immediately pressed against the resist-carrying master pattern 13 and then moved away. Resist material 14 transfers to surface 11 in the pattern of the master pattern 13.

Resist material 14 on surface 11 is then hardened moderately. This preferably is by controlled application of moderate UV light to surface 11, since resist material 14 is designed to harden under such radiation. Simply allowing loss of significant solvent from resist 14 is effective to achieve moderate hardening.

Pad 9 is then moved to circuit board 1 and surface 11 is pressed against the copper 7 and over one or more via holes 3. The resist material 14 transfers to board 1 in the pattern of the master pattern 13. That pattern of resist 15 is designed to cover a hole 3, and resist 15 is sufficiently hardened to be self-supporting over holes 3. (A single, uncovered hole 5 is shown for purposes of illustration; a single transfer from pad 9 may cover more than one hole simultaneously in the manner illustrated for the three holes 3.)

The steps subsequent to forming the resist pattern on the circuit board 1 may be conventional. The pattern of resist 15 defines electrical circuitry. Resist 15 is fully hardened by application of ultra violet radiation. Board 1 is then immersed in an etchant and copper 7 is etched away except where access of the etchant is blocked by the resist 15. In accordance with this invention resist 15 covers (or tents over) a via hole 3 and other such holes as described, and copper 7 is not etched from the inside of the holes. After etching, resist 15 is removed by a solvent specific to resist 15 or, in certain applications, resist 15 may be left as a permanent passivation covering. The copper in via holes 3 is in place and need not be added by a separate step.

Board 1 is shown having a part 17 in a different plane to the majority of board 1 to illustrate a three-dimensional circuit board. The part 17 may be located to position a display or other component, and typically is the same thickness as the majority of board 1 with side walls 19 for structural support (a side wall (not shown) on the side of part 17 opposite side wall 19 is symmetrical to side wall 19).

The use of pad printing is particularly advantageous to apply resist simultaneously to part 17 and the remainder of board 1 in a predetermined pattern as described. Pad 9 is pressed into the angle where part 17 meets board 1 carrying a pattern of resist 15 which transfers uninterrupted between part 17 and the remainder of board 1. Where pad printing is to be used for that purpose, the use of pad printing to cover via holes such as holes 3 and 5 and the like involves primarily only the addition of the hardening step as described, assuming the use of a resist which can be hardened to an intermediate state as described.

Typically, via holes pass entirely through the board 1 as shown for holes 3 and 5. Typically also, the board 1 is immersed in etchant. Resist 15 covering the holes must then be applied on both sides of board 1 where the holes exit. This is simply done by applying and fully hardening resist 15 on one side as described and then turning the card over and applying and fully hardening resist 15 on the other side as described. The hardened resist may be placed on a table surface or the like without damage to the resist. After the application and full hardening of the resist on both sides, copper 7 is etched as described.

A suitable resist material is as follows. This is a known formula for which moderate variations are not known to be significant to this invention. The essential formula is disclosed in U.S. Pat. No. 4,911,786 to Kindl et al and is the subject of U.S. application Ser. No. 318,536, filed Mar. 3, 1989, now U.S. Pat. No. 5,026,624. Variations in the formula are not believed significant to this invention, but that specifically used has resins as discussed below of about 28.5% Heloxy WC8402, about 42.8% EpiRez 5183, about 23.8% SU-8 and about 4.9% UVE 1014.

The foregoing material has been found to serve excellently both as a masking material for the etchant and a passivation material afterwards and also if plating is done serves as a protective coating during the preparation for and plating operations such as gold plating. Broadly, the preferred material is in epoxy resin which consists essentially from about 10% to about 80% by weight of a polyol resin which is a condensation product of epichlorohydrin and bisphenol A having a molecular weight of between 40,000 and 130,000 and between 20% and 90% by weight of epoxidized octafunctional bisphenol A formaldehyde novolak resin having a molecular weight between about 4,000 and 10,000, and optionally, if flame retardancy is required, up to about 50% by weight of an epoxidized di-glycidyl ether of tetrabromo bisphenol A having a melting point of between about 90° C. and 110° C. and a molecular weight of between about 600 and 2500 and between about 0.1 to about 15 parts by weight of resin of a cationic photoinitiator capable of initiating polymerization of the epoxidized resin system upon exposure to radiation. A suitable polyol resin which is a condensation product of epichlorohydrin and bisphenol A is resin sold under the Trade Mark Heloxy WC8402 by Union Carbide Corporation. A suitable epoxidized octafunctional bisphenol A formaldehyde novolak resin is sold under the Trade Mark EpiRez SU-8 by High-Tek Polymers, Inc.; a suitable epoxidized di-glycidal ether of tetrabromo bisphenol A is sold under the Trade mark EpiRez 5183 by High-Tek Polymers Inc.; and a suitable photoinitiator is a complex triaryl sulfonium hexafluoroantimonate salt sold by General Electric Co. under the Trade Mark UVE1014. The material may also optionally contain up to about 10 parts by weight of a photosensitizer such as anthracene and perylene or their derivatives. These materials are discussed in detail in said application U.S. Ser. No. 318,536. If desired, a surfactant, such as FC 430 sold by 3M Corporation can be added in amounts up to 1 part per 100 by weight, specifically 0.025% by weight in the foregoing specific formula. Also, various dyes such as Malachite Green, Ethyl violet, and Rhodamine B can be used in amounts up to about 1 part per 100 by weight, specifically 0.075% by weight Ethyl violet in the foregoing specific formula for optical and visual observation of the resist when printed.

The foregoing specific formula also contains solvents about as follows: 52 parts propylene glycol methyl ether, 3 parts methyl isobutyl ketone and 2 parts propylene carbonate. There solvents are combined with 40 parts by weight of the resins, initiator, dye and surfactant.

Variations within the spirit and scope of this invention can be anticipated.

What is claimed is:

1. A method of electrical circuit manufacture comprising applying a resist material to a transfer surface in a pattern, moderately hardening said applied resist material, transferring said pattern by applying said transfer surface to a metalized circuit board having at least one metalized via at a position at which said pattern covers said via, further hardening said resist material in a pattern defining an electrical circuit and covering said via, and then forming a circuit pattern by etching said circuit board carrying said further-hardened resist material while said via is protected from being etched by said resist material covering said via.

2. The method as in claim 1 in which said moderate hardening is by application of radiation to which said resist material responds for said further hardening.

3. The method as in claim 2 in which said circuit board is a three-dimensional circuit board.

4. The method as in claim 1 in which said circuit board is a three-dimensional circuit board.

5. A method of electrical circuit manufacture comprising applying a resist material to a transfer surface in a pattern, moderately hardening said applied resist material, transferring said pattern by applying said pad to a three-dimensional metalized circuit board having at least one metalized via at a position at which said pattern covers said via and by applying said transfer surface to said circuit board to transfer said resist material pattern where surfaces of said circuit board meet to form said three dimensions, further hardening said resist material in a pattern covering said via and defining an electrical circuit which extends across where said surfaces of said circuit board meet to form said three dimensions, and then forming a circuit pattern by etching said circuit board carrying said further-hardened resist material while said via is protected from being etched by said resist material covering said via.

6. The method as in claim 5 in which said moderate hardening is by application of radiation to which said resist material responds for further hardening.

* * * * *